United States Patent
Mine et al.

(10) Patent No.: US 10,737,937 B2
(45) Date of Patent: Aug. 11, 2020

(54) SENSOR CHARACTERISTIC EVALUATION METHOD AND CHARGED PARTICLE BEAM DEVICE

(71) Applicant: HITACHI, LTD., Tokyo (JP)

(72) Inventors: Toshiyuki Mine, Tokyo (JP); Keiji Watanabe, Tokyo (JP); Koji Fujisaki, Tokyo (JP); Masaharu Kinoshita, Tokyo (JP); Masatoshi Morishita, Tokyo (JP); Daisuke Ryuzaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/182,659

(22) Filed: Nov. 7, 2018

(65) Prior Publication Data
US 2019/0292046 A1  Sep. 26, 2019

(30) Foreign Application Priority Data
Mar. 26, 2018  (JP) .................. 2018-058900

(51) Int. Cl.
| | |
|---|---|
| *B81C 99/00* | (2010.01) |
| *G01R 31/28* | (2006.01) |
| *H01J 37/30* | (2006.01) |
| *H01J 37/305* | (2006.01) |
| *H01J 37/304* | (2006.01) |
| *G01R 31/50* | (2020.01) |

(52) U.S. Cl.
CPC .......... *B81C 99/004* (2013.01); *B81C 99/005* (2013.01); *G01R 31/2829* (2013.01); *G01R 31/50* (2020.01); *H01J 37/304* (2013.01); *H01J 37/3005* (2013.01); *H01J 37/3056* (2013.01); *B81C 2201/0132* (2013.01); *B81C 2201/0143* (2013.01); *H01J 2237/24564* (2013.01); *H01J 2237/24585* (2013.01); *H01J 2237/31749* (2013.01)

(58) Field of Classification Search
CPC .............. B81C 99/0044; B81C 99/005; B81C 2201/0132; B81C 2201/0143; G01R 31/50; G01R 31/2829; H01J 37/3005; H01J 37/304; H01J 37/3056; H01J 2237/24564; H01J 2237/24585; H01J 2237/31749
See application file for complete search history.

(56) References Cited

FOREIGN PATENT DOCUMENTS

JP    2013-234855 A    11/2013

*Primary Examiner* — Timor Karimy
(74) *Attorney, Agent, or Firm* — Volpe and Koening, P.C.

(57) ABSTRACT

A redeposited material is removed so as to electrically observe a microelement without causing foreign matters or metal contamination. An FIB device (charged particle beam device) includes an FIB barrel which discharges the focused ion beam (charged particle beam), a stage which holds a sample (substrate), a microcurrent measuring device (current measuring unit) which measures a leakage current from the sample, and a timer (time measuring unit) which measures a time to emit the focused ion beam and a time to measure the leakage current. Further, the FIB device includes a system control unit (control unit) which synchronizes a time to emit the focused ion beam and a time to measure the leakage current by the microcurrent measuring device.

12 Claims, 12 Drawing Sheets

11 : SAMPLE (SUBSTRATE)
13 : STAGE
20 : FIB DEVICE (CHARGED PARTICLE BEAM DEVICE)
21 : FOCUSED ION BEAM (FIB, CHARGED PARTICLE BEAM)

SENSOR CHARACTERISTIC EVALUATION METHOD AND CHARGED PARTICLE BEAM DEVICE

TECHNICAL FIELD

The invention relates to a sensor characteristic evaluation method and a charged particle beam device, in which a charged particle beam is used.

BACKGROUND ART

As a technique of locally processing a semiconductor substrate such as silicon (Si), there is known a technique using a focused ion beam (hereinafter, referred to as "FIB"). The focused ion beam is also used in forming a sensor element, for example, by a MEMS (Micro Electro Mechanical Systems) technique.

In addition, in the manufacturing of a MEMS sensor, there is considered a direct manufacturing using the FIB in order to shorten a TAT (Turn Around Time). In the direct manufacturing using the FIB, a workpiece is attached to the periphery again (this phenomenon will be referred to as redeposition, and a foreign matter attached by the redeposition is called a redeposited material). In a case where the redeposited material is an insulating film, and the material is attached to a wiring connection portion, a contact resistance may be increased, or a disconnection failure may be caused. On the other hand, in a case where the redeposited material is a conductor film, a short circuit failure may be caused between wirings or between electrodes. Therefore, in the direct manufacturing using the FIB, there is a need to remove the redeposited material for sure.

For example, JP-A-2013-234855 (PTL 1) discloses a technique of observing a sample by an FIB processing while emitting an ion beam to remove the redeposited material attached to a sample surface.

CITATION LIST

Patent Literature

PTL 1: JP-A-2013-234855

SUMMARY OF INVENTION

Technical Problem

In the technique disclosed in PTL 1, there is a need to connect a lead wire to the sample when the removal of the redeposited material is observed. When the lead wire is connected to the sample, there is required a relatively large region. For example, a small MEMS element is not suitable to the technique.

In addition, the connection work of the lead wire easily causes foreign matters to be attached to the periphery of the element, and a metal contamination as accompanied by the lead wire contact occurs. Further, the foreign matters are necessarily be removed to clean the lead wire in order to process the sample as the procedure proceeds, and such a work is significantly difficult itself.

An object of the invention is to provide a technology in which a redeposited material is removed so as to electrically observe even a microelement without causing foreign matters or metal contamination.

The above object and novel features of this disclosure will be apparent through the explanation and the accompanying drawings of this specification.

Solution to Problem

In the embodiments disclosed in this application, representative outlines will be simply described as follows.

A representative sensor characteristic evaluation method includes (a) a procedure of a focused ion beam processing in which a focused ion beam is emitted to a substrate to form a pattern for a sensor, or the pattern for the sensor and a test pattern and (b) a procedure of emitting a charged particle beam to any one of the pattern for the sensor and the test pattern and measuring a leakage current from the substrate. Then, the sensor is evaluated on the basis of a measurement result of the leakage current.

In addition, a representative charged particle beam device includes a charged particle beam discharging unit which discharges the charged particle beam, a stage which holds the substrate, and a current measuring unit which measures the leakage current from the substrate. Further, the charged particle beam device includes a time measuring unit which measures a time to emit the charged particle beam and a time to measure the leakage current, and a control unit which synchronizes the time to emit the charged particle beam discharged from the charged particle beam discharging unit and the time to measure the leakage current by the current measuring unit. Then, the control unit synchronizes the time to emit the charged particle beam discharged from the charged particle beam discharging unit and the time to measure the leakage current by the current measuring unit. In this state, the charged particle beam is emitted to the substrate. The current measuring unit measures the leakage current from the substrate to evaluate the sensor which is formed in the substrate.

Advantageous Effects of Invention

Making an explanation simply about an effect obtained by the representative outline in the invention disclosed in this application, the following effect is obtained.

Whether the redeposited material is removed from the microsensor element can be checked in a non-destructive and non-contact manner. A manufacturing yield of the sensor can be improved.

DESCRIPTION OF EMBODIMENTS

First Embodiment

Figure 1:
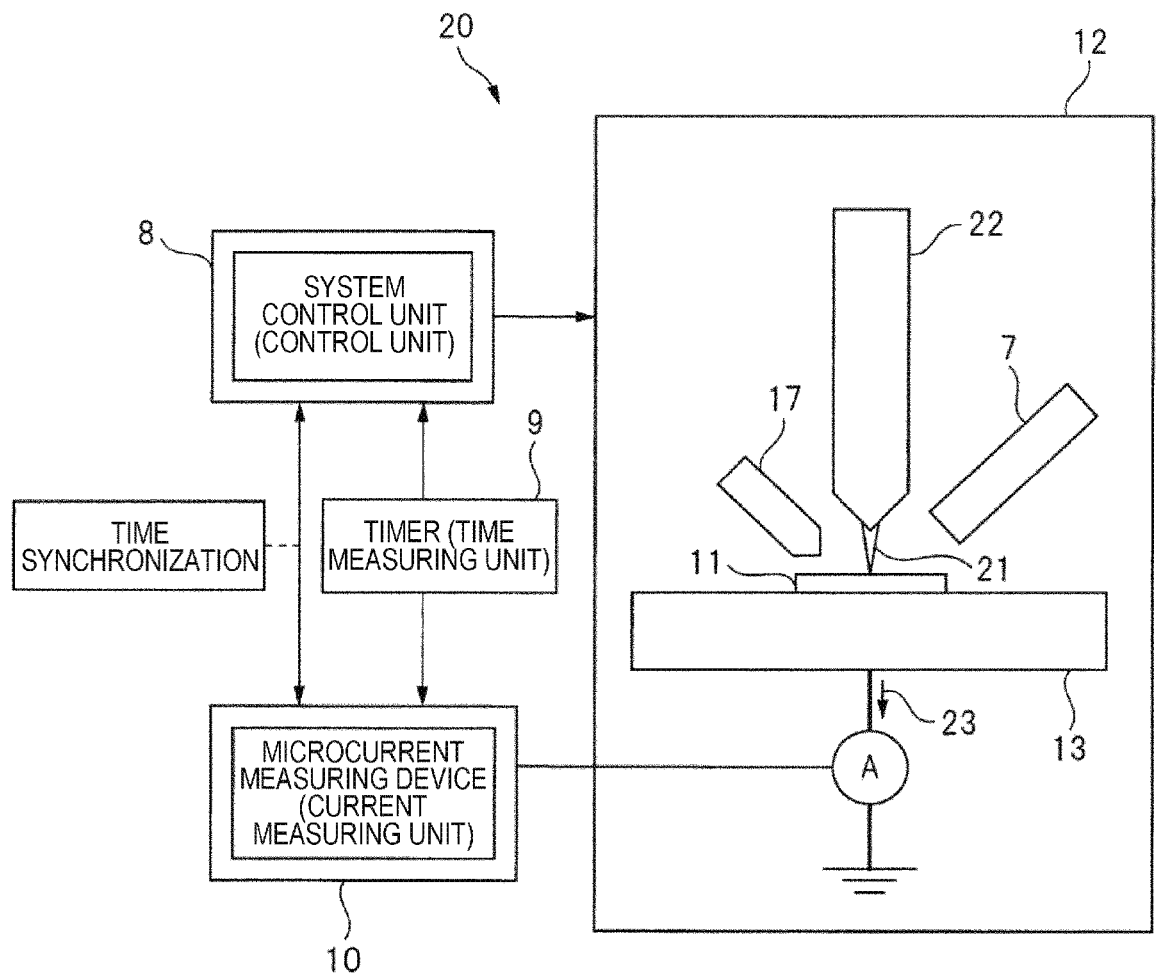
FIG. 1 is a schematic diagram illustrating an exemplary configuration of a charged particle beam device of a first embodiment of the invention.

FIG. 1 is a schematic diagram illustrating an exemplary configuration of a charged particle beam device of a first embodiment of the invention.

The configuration of the charged particle beam device of the first embodiment will be described using FIG. 1. Further, in the first embodiment, an FIB device 20 for processing a sample 11 such as a substrate using the focused ion beam 21 will be described as an example of the charged particle beam device.

The FIB device 20 illustrated in FIG. 1 includes a device body 12 which is provided with a chamber in which irradiation of the focused ion beam (FIB, charged particle beam) 21 to the sample 11 is performed. Further, in the chamber, provided is an FIB barrel (charged particle beam discharging unit) 22 which discharges the focused ion beam 21.

In addition, a stage 13 holding the sample 11 such as a substrate is provided to face the FIB barrel 22.

In addition, besides the FIB barrel 22, there are provided, on the upper side of the stage 13, an electronic beam barrel 7 which is used to irradiate the sample 11 with an electronic beam and observe an SEM (Scanning Electron Microscope) image, and a gas gun 17 which discharges an etching gas (see FIG. 3 below) 14 to the sample 11 when removing a redeposited material after the FIB processing.

In addition, the FIB device 20 includes a microcurrent measuring device (current measuring unit) 10 which measures a leakage current 23 leaking from the sample 11 and also from the stage 13, and a timer (time measuring unit) 9 which measures a time to emit the focused ion beam (charged particle beam) 21 and a time to measure the leakage current 23.

Further, the FIB device 20 includes a system control unit (control unit) 8 which synchronizes the time to emit the focused ion beam 21 discharged from the FIB barrel 22 with the time to measure the leakage current 23 of the microcurrent measuring device 10.

In other words, the FIB device 20 of the first embodiment measures the time to emit the focused ion beam 21 and the time to measure the leakage current 23 by the timer 9, and further, the system control unit 8 synchronizes the time to emit the focused ion beam 21 discharged from the FIB barrel 22 with the time to measure the leakage current 23 by the microcurrent measuring device 10.

Figure 2:
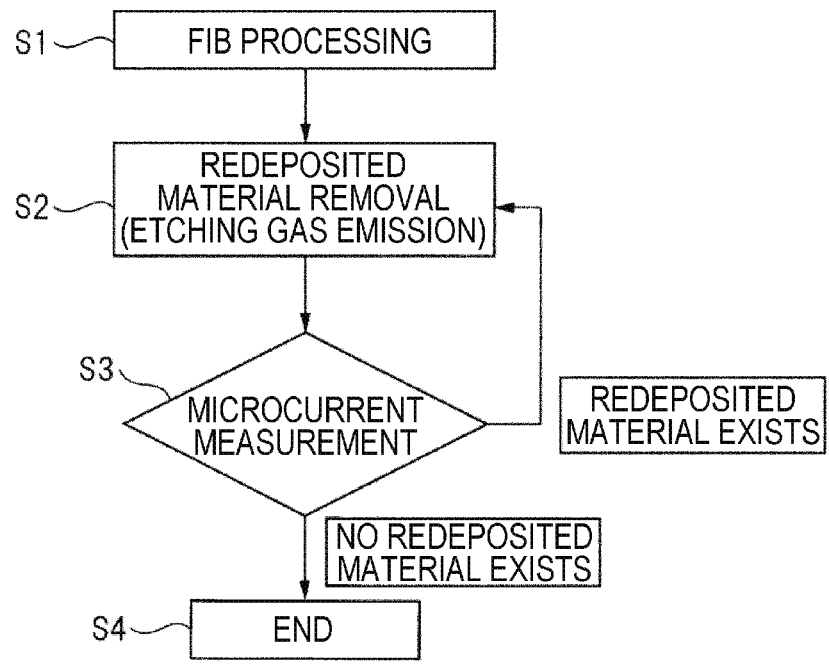
FIG. 2 is a flowchart illustrating an example of a processing procedure of a sensor characteristic evaluation method of the first embodiment using the charged particle beam device illustrated in FIG. 1.
Figure 3:
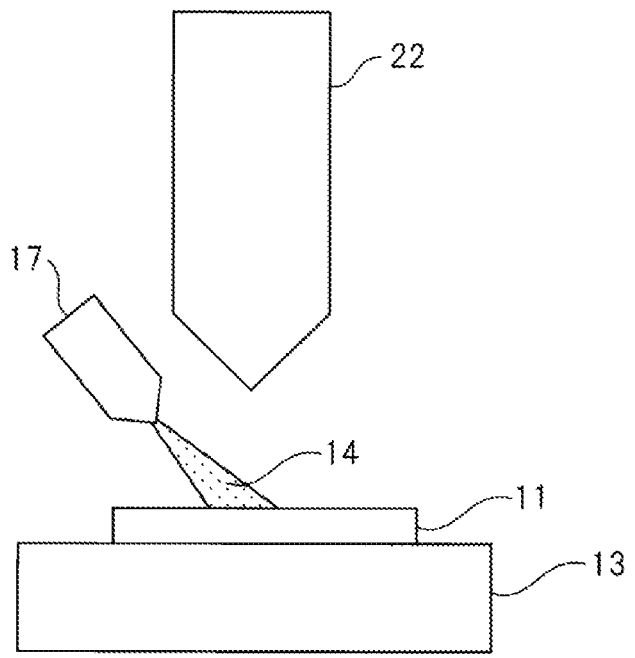
FIG. 3 is a schematic diagram illustrating an example of a removal method of a redeposited material in the first embodiment of the invention.

Next, the outline of a sensor characteristic evaluation method of the first embodiment will be described using FIGS. 1 to 3. FIG. 2 is a flowchart illustrating an example of a processing procedure of the sensor characteristic evaluation method of the first embodiment using the charged particle beam device illustrated in FIG. 1. FIG. 3 is a schematic diagram illustrating an exemplary removal method of the redeposited material in the first embodiment of the invention.

First, an FIB processing of Step S1 illustrated in FIG. 2 is implemented. Herein, in the FIB device 20 illustrated in FIG. 1, the sample 11 such as a substrate held on the stage 13 is irradiated with the focused ion beam 21 from the FIB barrel 22 to implement the FIB processing.

Figure 5:
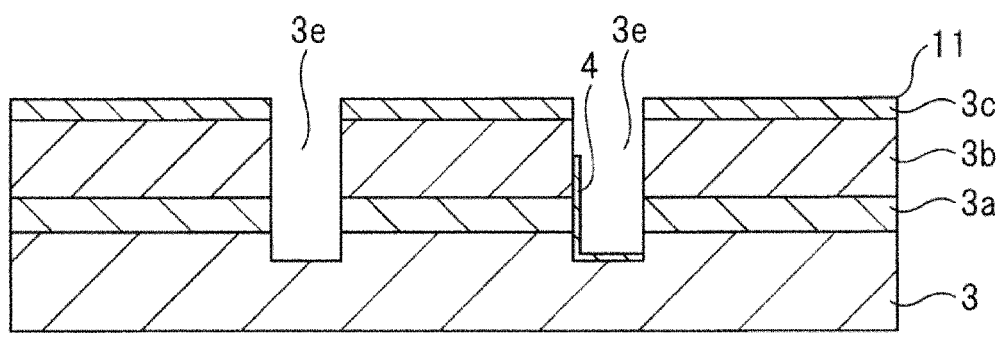
FIG. 5 is a cross-sectional view illustrating an exemplary structure in which the redeposited material is attached in a structure taken along line A-A illustrated in FIG. 4.

At this time, the redeposited material is easily attached to a portion which has been processed by the focused ion beam 21. For example, in a case where a groove 3e illustrated in FIG. 5 is formed by emitting the focused ion beam 21, a Si film 4 and the like may be attached in the groove 3e as the redeposited material.

In such a case, there may cause a failure if the Si film 4 is not removed.

Therefore, the redeposited material removal shown in Step S2 is performed. Herein, for example, as illustrated in FIG. 3, the sample 11 is irradiated with the etching gas for an etching process, and the Si film 4 which is the redeposited material is removed.

After removing the redeposited material, a microcurrent measurement (energizing check) illustrated in Step S3 is performed. At that time, at least before the microcurrent measurement starts, the time to emit the focused ion beam 21 and the time to measure the leakage current 23 are measured by the timer 9 illustrated in FIG. 1, and further, the time to emit the focused ion beam 21 discharged from the FIB barrel 22 and the time to measure the leakage current 23 by the microcurrent measuring device 10 are synchronized by the system control unit 8.

With this configuration, the emission start of the focused ion beam 21 and the measurement start of the leakage current 23 can be matched in timing.

In the microcurrent measurement of the first embodiment, the focused ion beam 21 emitted to the sample 11 is used instead of a probe for measurement. In other words, when the sample 11 is irradiated with the focused ion beam 21 the leakage current 23 leaking out of the rear surface side of the sample (substrate) 11 is measured, and the state of a pulse waveform of the leakage current 23 is monitored. With this configuration, it is determined whether the redeposited material is left. As illustrated in FIG. 2, in a case where it is determined that there is no redeposited material, the characteristic evaluation of the sensor ends (Step S4). On the contrary, in a case where it is determined that there is a redeposited material, the redeposited material removal of Step S2 is performed again, and then the microcurrent measurement illustrated in Step S3 is performed again. Then, until it is determined that there is no redeposited material, the removal of the redeposited material and the microcurrent measurement are repeated.

Further, in the characteristic evaluation of the sensor of the first embodiment, it is preferable that the microcurrent measurement be performed using the FIB device 20 at a stage during a microelement such as a MEMS sensor being manufactured.

Herein, the value of a beam current (emission current amount) of the focused ion beam 21 at the time of the microcurrent measurement illustrated in Step S3 is 10 pA to 1 µA, and a spot diameter is 100 nm to 5 pA. For example, the value of the beam current is 1 nA. On the other hand, the spot diameter is about 200 nm.

Next, the details of the sensor characteristic evaluation method of the first embodiment will be described using FIGS. 4 to 9. The redeposited materials are different due to material and structure processed by the FIB, and may be a conductor (conductor film) or an insulator (insulating film). In the first embodiment, the redeposited material is a conductor film, and an insufficient removal of the redeposited material (left redeposited material) causes a short circuit failure. In the first embodiment, a manufacturing procedure of the MEMS sensor will be described as an example. In addition, herein, illustrated is an example in which the sample 11 is irradiated with a Xe-plasma focused ion beam to check whether the redeposited material is removed.

Figure 4:
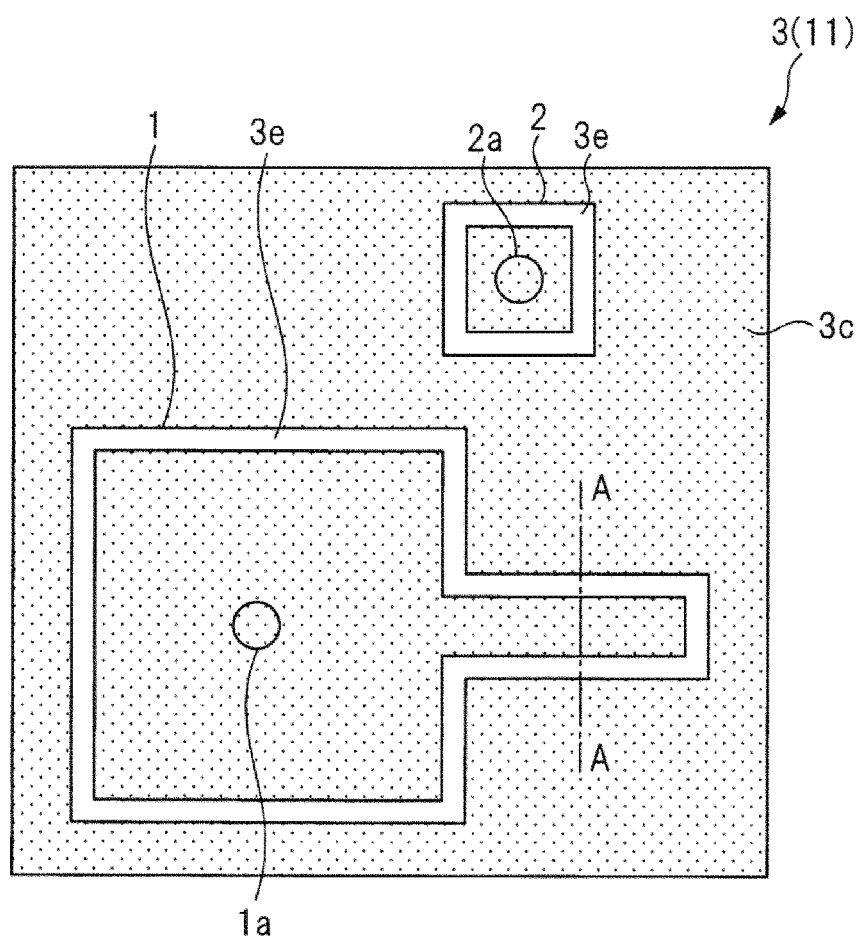
FIG. 4 is a top view illustrating an example of a measurement pattern in the sensor characteristic evaluation method of the first embodiment of the invention.

In FIG. 4, as an example of the MEMS sensor (a microstructural sensor) which is processed by emitting the focused ion beam 21 in the FIB device 20, a configuration having a cantilever sensor 1 formed therein is illustrated, and further a test element 2 is formed near the cantilever sensor 1.

First, the FIB processing is performed by emitting the focused ion beam 21 to the substrate which is the sample 11 to form the cantilever sensor (MEMS sensor) 1. Alternatively, the FIB processing (the FIB processing illustrated in Step S1 of FIG. 2) is performed by emitting the focused ion beam 21 to the substrate which is the sample 11 to form the cantilever sensor 1 and the test element 2. At that time, it is measured (checked) whether the value of the beam current of the focused ion beam 21 is a setting value using a Faraday cup 15 to be described later illustrated in FIG. 7.

Figure 6:
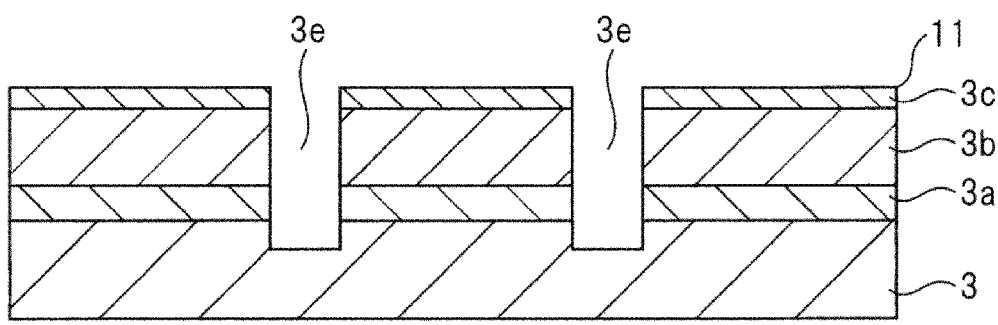
FIG. 6 is a cross-sectional view illustrating an exemplary structure in which the redeposited material is not attached in the structure taken along line A-A illustrated in FIG. 4.

Further, FIG. 4 illustrates an example of a state in which a SOI (Silicon On Insulator) film 3b is formed on an Si substrate 3 illustrated in FIGS. 5 and 6 with an oxide film (BOX layer) 3a interposed therebetween to form an SOC substrate, the SOC substrate is subjected to the FIB processing to be a predetermined shape, and then a removal process of the Si film (redeposited material) 4 is performed. A SiN film 3c is formed in the upper layer of the SOI film 3b.

In addition, FIG. 5 illustrates a structure in which the redeposited material of the Si film 4 is partially left in the cantilever sensor 1 processed with the FIB. FIG. 6 illustrates a structure in which the redeposited material is removed from the structure of the cross section taken along line A-A of FIG. 4.

Figure 7:
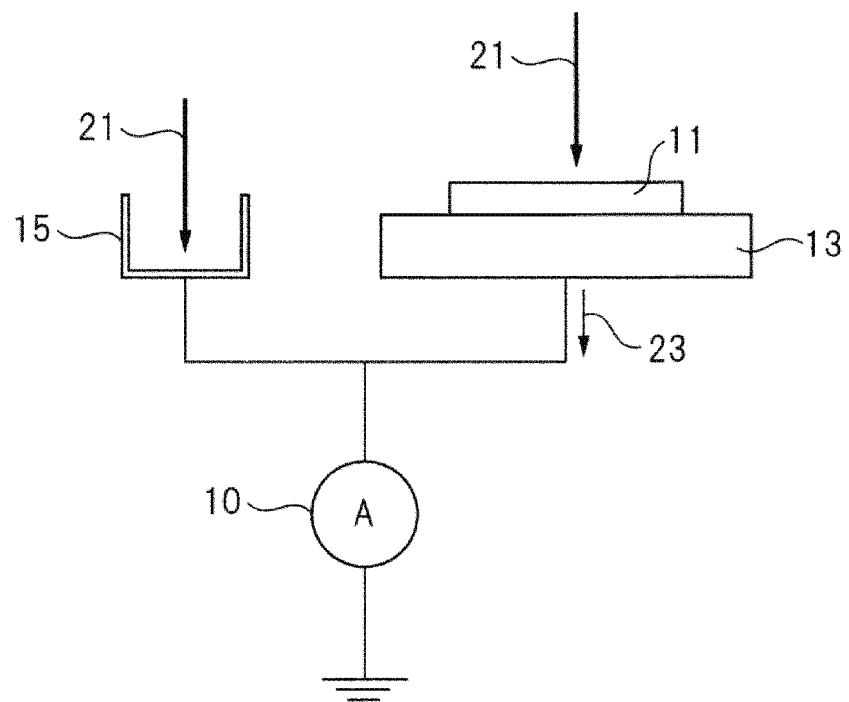
FIG. 7 is a schematic diagram illustrating an example of a measurement method of a leakage current using the measurement pattern illustrated in FIG. 4.

FIG. 7 is a schematic diagram illustrating an exemplary measurement method of the leakage current using a measurement pattern illustrated in FIG. 4. The FIB device 20 has the Faraday cup to measure an emission current, and performs the FIB processing after a desired emission current (beam current) is initially adjusted (checked) by the Faraday cup 15. Then, the stage 13 holding the sample 11 which is the substrate and the Faraday cup 15 are connected to the same current meter (the microcurrent measuring device 10 illustrated in FIG. 1), and is configured to monitor the current value (the leakage current 23 from the sample 11) during the FIB processing.

Figure 8:
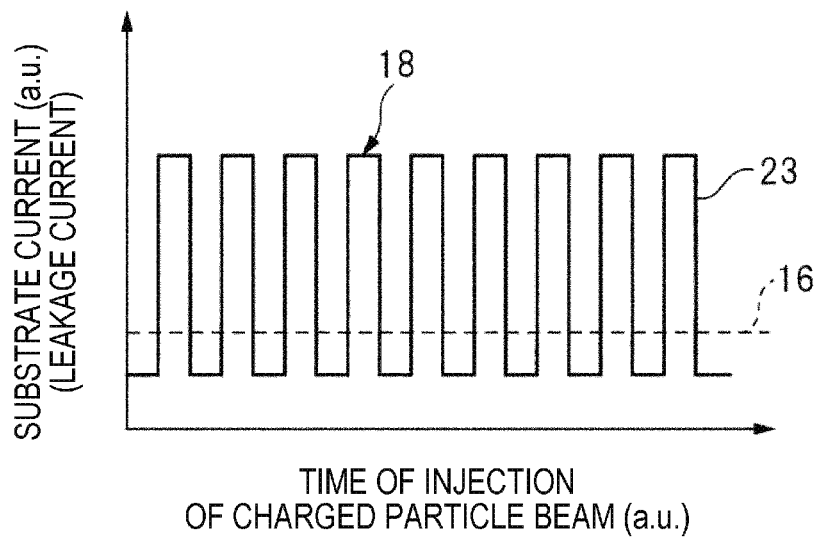
FIG. 8 is a diagram of a pulse waveform illustrating an exemplary measurement result of the leakage current in the structure illustrated in FIG. 5 where the redeposited material is attached.
Figure 9:
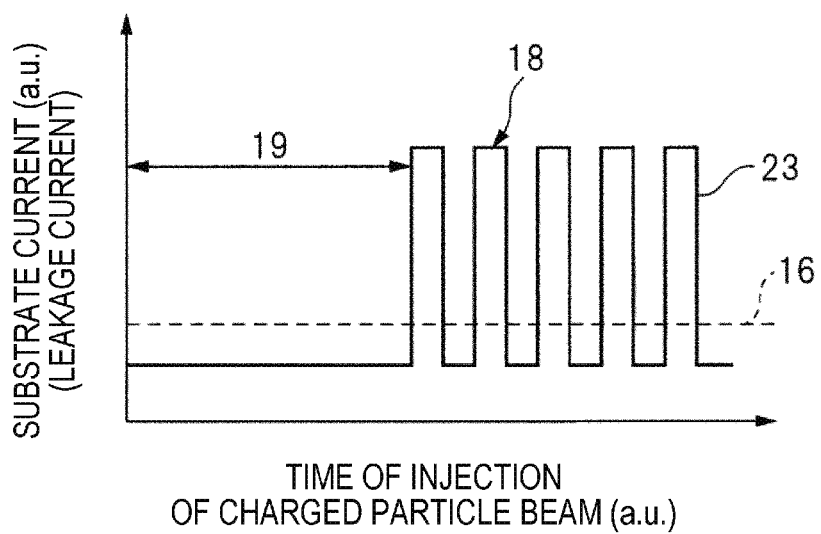
FIG. 9 is a diagram of a pulse waveform illustrating an exemplary measurement result of the leakage current in the structure illustrated in FIG. 6 where the redeposited material is not attached.

FIG. 8 is a diagram of a pulse waveform illustrating an exemplary measurement result of the leakage current in the structure illustrated in FIG. 5 in which the redeposited material is attached. FIG. 9 is a diagram of a pulse waveform illustrating an exemplary measurement result of the leakage current in the structure illustrated in FIG. 6 in which the redeposited material is not attached.

After performing the FIB processing to form the cantilever sensor 1 illustrated in FIG. 4 or the cantilever sensor 1 and the test element 2, the redeposited material removal illustrated in Step S2 of FIG. 2 is performed. Herein, for example, as illustrated in FIG. 3, the sample 11 is irradiated with the etching gas 14 to perform the etching process, and the Si film 4 illustrated in FIG. 5 which is the redeposited material is removed. The etching gas 14 used herein is, for example, a $XeF_2$ gas.

After removing the redeposited material, the microcurrent measurement (energizing check) illustrated in Step S3 of FIG. 2 is performed. First, a spot diameter, a current amount, and a pulse width of the focused ion beam 21 which is emitted to a sample body (the cantilever sensor 1) or the test element (test pattern) 2 for removing the redeposited material, and a determination current value 16 of the leakage current 23 are set. The spot diameter of the focused ion beam 21 is preferably set to fall within a predetermined range in consideration of beam spreading.

In addition, it is desirable that an ion beam of a rare gas such as He, Ne, Ar, Kr, or Xe besides an Ga ion beam is employed as the focused ion beam 21 in the microcurrent measurement.

In addition, the focused ion beam 21 in the microcurrent measurement is injected by selecting an optimal acceleration voltage (average injection depth control), an optimal pulse width, and an optimal emission current. In other words, it is desirable to select a condition in which the average injection depth is appropriate, and the emission current does not cause a damage on an element. Specifically, the energizing condition is set differently from that at the time of the FIB processing such that the focused ion beam 21 does not pass through the rear surface of the substrate.

Further, the value of the beam current (emission current) of the focused ion beam 21 in the microcurrent measurement is, for example, 10 pA to 1 µA, and the spot diameter is 100 nm to 5 μA. For example, the value of the beam current is 1 nA. On the other hand, the spot diameter is about 200 nm.

In addition, a maximum value of a substrate (the leakage current 23) measured in the microcurrent measurement becomes a total sum of the emission current and a secondary electronic current generated in the sample. The magnitude of the emission current is necessarily set to fall within a range not causing a damage on the element characteristics. Alternatively, in a case where the current emission to the element cannot be allowed, the test element 2 for removing the redeposited material is used.

Then, the determination current value 16 on the redeposited material removal illustrated in FIGS. 8 and 9 is set to a current value smaller than the maximum value (the total current 18 which is the sum of the injection current (emission current) and the secondary electronic current) of the substrate current (the leakage current 23). In other words, the determination current value 16 to determine whether the redeposited material is left is set to a current value smaller than the total current 18 which is the sum of the injection current and the secondary electronic current. Further, even though the observed substrate current (the leakage current 23) depends on the redeposited material and an attached state, the presence/absence of the redeposited material causes the number of places in a number representing the observed substrate current to vary, and thus it is possible to easily determine whether there is a redeposited material by the observation on the substrate current.

As described above, in the microcurrent measurement (energizing check), first, the focused ion beam 21 with an arbitrary pulse width is emitted to the substrate which is the sample 11. At that time, the focused ion beam 21 is emitted at a spot with respect to a local region 1a of the cantilever sensor 1 or a local region 2a of the test element 2 illustrated in FIG. 4.

At this time, as illustrated in FIG. 7, the focused ion beam 21 is emitted to the Faraday cup 15 in advance to check whether it is a desired emission current (beam current), and then of the focused ion beam 21 of a desired beam current is emitted to the sample 11. In other words, the focused ion beam 21 is emitted to any one of the cantilever sensor 1 and the test element 2, and the leakage current 23 from the sample 11 at that time is measured by the microcurrent measuring device 10 illustrated in FIG. 1. Then, the cantilever sensor 1 is evaluated on the basis of the measurement result of the leakage current 23.

Specifically, the leakage current 23 from the sample 11 caused by the emission of the focused ion beam 21 is measured, thereby obtaining the pulse waveform of the leakage current 23 based on the state of which the cantilever sensor 1 is evaluated. Herein, it is checked whether the Si film 4 (redeposited material) is attached to the groove 3e of the sample 11 illustrated in FIG. 5.

Further, when a viewpoint is changed in the microcurrent measurement (energizing check), the leakage current 23 from the stage 13 supporting the sample 11 is measured. Then, the cantilever sensor 1 is evaluated based on the state of the pulse waveform of the leakage current 23.

In addition, in the microcurrent measurement (energizing check), the cantilever sensor 1 may be evaluated by emitting the focused ion beam 21 to the test element 2 formed near the cantilever sensor 1 instead of the cantilever sensor 1 illustrated in FIG. 4. Further, in the microcurrent measurement (energizing check) of the first embodiment, the cantilever sensor 1 is evaluated by detecting whether the Si film 4 which is a semiconductor film having conductivity is attached to the groove 3e of any one of the cantilever sensor 1 and the test element 2 of the Si substrate 3 on the basis of the state of the pulse waveform of the leakage current 23. Further, a target film for which is determined whether to have been attached to the groove 3e of the Si substrate 3 as the redeposited material is not limited to the semiconductor film, and any film having conductivity such as a conductor film may be used as long as the film is conductive.

Further, in the microcurrent measurement, it is desirable that the emission start time of the focused ion beam 21 and the measurement start time of the substrate current (the leakage current 23) are synchronized so as to make the current measurement of an extremely short time possible. In other words, it is desirably that the time to emit the focused ion beam 21 and the time to measure the leakage current 23 are synchronized using the timer 9 illustrated in FIG. 1 to evaluate the cantilever sensor 1.

Specifically, in a case where the redeposited material is not removed even after the removal process of the redeposited material (Step S2 of FIG. 2), as illustrated in FIG. 5, the Si film (redeposited material) 4 serves as a current path. Therefore, as illustrated in FIG. 8, the pulse waveform of the pulse current of the emitted focused ion beam 21 is observed as it is. At that time, the current equal to or more than the determination current value 16 is observed from the initial period of the measurement start. In this case, it is possible to determine that there is a redeposited material.

On the other hand, in a case where the redeposited material is removed as illustrated in FIG. 6 after the removal process of the redeposited material, the substrate current (the leakage current 23) is equal to or less than the determination current value 16 until a certain amount of charges are accumulated in the cantilever sensor 1 (MEMS sensor) of a floating state as illustrated in FIG. 9. When the charges are accumulated in the cantilever sensor 1 of the floating state, the leakage current 23 flows out of there even though there is no redeposited material. Therefore, after a predetermined charge accumulation time 19 elapses, the pulse waveform of the pulse current of the emitted focused ion beam 21 is observed as it is. In other words, it is important that the presence/absence of the redeposited material is determined within the charge accumulation time 19 of the cantilever sensor 1. Then, the charge accumulation time 19 strongly depends on each dimension of the cantilever sensor 1 and the emission current amount. Therefore, the emission start time of the focused ion beam 21 and the measurement start time of the leakage current 23 are synchronized, so that the presence/absence of the redeposited material can be determined with a high accuracy.

Then, in a case where the charge accumulation time 19 exists at the initial stage of the start of the microcurrent measurement (the measurement of the leakage current) as illustrated in FIG. 9, and then the pulse waveform is observed, it is determined that there is no redeposited material, and the process ends as shown in Step of FIG. 2.

In this regard, as illustrated in FIG. 8, in a case where the pulse waveform is observed from the initial stage of the start of the microcurrent measurement, it is determined that there is a redeposited material, and the leakage current 23 is measured again. In this case, as illustrated in FIG. 2, the procedure returns to Step S2, and the redeposited material removal is performed. In other words, as illustrated in FIG. 3, the sample 11 is irradiated with the etching gas 14 to be etched, and the redeposited material is removed. In this way, the redeposited material removal of Step S2 of FIG. 2 and the microcurrent measurement of Step S3 are performed repeatedly using the FIB device 20 illustrated in FIG. 1 until the redeposited material attached to the cantilever sensor 1 of the sample 11 is removed.

Further, there are various methods as the removal method of the redeposited material. In a case where the etching gas 14 such as a $XeF_2$ gas is emitted in the FIB device 20 to remove the redeposited material, the redeposited material removal can be performed without a large movement of the sample 11 in the same FIB device 20. In other words, in the same FIB device 20, the process of the redeposited material removal and the process of checking the redeposited material removal (the process of the microcurrent measurement) can be performed continuously. Therefore, a throughput of the removal process of the redeposited material can be obtained.

According to the characteristic evaluation method of the cantilever sensor 1 and the charged particle beam device (the FIB device 20) of the first embodiment, the focused ion beam 21 is emitted to the main pattern of the cantilever sensor 1 processed using the FIB or the test element 2 formed near the main pattern, and a microcurrent flowing from the sample 11 to the stage 13 is monitored. Therefore, the state of the cantilever sensor 1 can be evaluated. At this time, the cantilever sensor 1 is a microelement formed in the sample 11.

Specifically, after the microelement is processed in a desired shape using the FIB, a procedure of removing the redeposited material attached near the processing region in the FIB processing, and a procedure of emitting the focused ion beam 21 to a predetermined region of the microelement to measure a current value flowing to the stage 13 supporting the sample 11 thereby determining the presence/absence of the redeposited material are performed repeatedly. Then, the redeposited material is removed until the current value (the magnitude of the leakage current 23) when the focused ion beam 21 is emitted is equal to or less, or equal to or greater than a predetermined current value.

In addition, the spot diameter of the charged particle beam such as the focused ion beam 21 is easily converged down to about several 10s nm. Therefore, the emitting current amount and time can be controlled arbitrarily. In other words, in a case where the characteristic of the sensor of the first embodiment is evaluated, the charged particle beam serves as a probe for observing the cantilever sensor 1. Therefore, it is possible to observe the cantilever sensor 1 in a non-contact state.

In other words, the presence/absence of the redeposited material in the microsensor element such as the cantilever sensor 1 can be checked in a non-destructive and non-contact manner. A manufacturing yield of the microsensor elements can be improved.

In addition, since the presence/absence of the redeposited material in the microsensor element such as the cantilever sensor 1 can be checked in a non-destructive and non-contact manner, it is possible to suppress a foreign matter generation, and a metal contamination accompanied by observation of the redeposit material removal.

Further, since the foreign matter and the metal contamination can be suppressed, it can be easily applied to the process of the next procedure. A throughput or a manufacturing yield of the microsensor elements such as the cantilever sensor 1 can be improved.

In addition, in the characteristic evaluation of the sensor of the first embodiment, the microcurrent measurement can also be performed using the FIB device 20 at a stage of manufacturing the microelement such as the cantilever sensor (MEMS sensor) 1.

With this configuration, a failure is not found out after the manufacturing of microelement has been finished, but is found out during the manufacturing, and the failure can be recovered at the stage. Therefore, it is possible to improve a manufacturing yield of products such as the MEMS sensor. Further, it is possible to reduce the cost of the product.

In addition, the focused ion beam 21 is emitted to a predetermined place in the FIB device 20 of the first embodiment in the middle of manufacturing the MEMS sensor such as the cantilever sensor 1, so that the substrate current (the leakage current 23) is measured to check whether the MEMS sensor is operated. For example, in a case where a switching of the MEMS sensor occurs by injecting a predetermined amount of ions or electrons, the operation determination becomes possible. At this time, in a case where the operation of the MEMS sensor is not possible, the removal process of the redeposited material is performed again, and an operation check of the MEMS sensor is performed again.

In addition, in the characteristic evaluation method of the cantilever sensor 1 and the FIB device 20 of the first embodiment, the time of the emission start of the charged particle beam and the time of the measurement start of the substrate current are synchronized, so that by an emission method and a current determination method of a predetermined charged particle beam being used, it is possible to realize a device which automatically determines the presence/absence of the redeposited material.

In addition, in the characteristic evaluation of the sensor of the first embodiment, the FIB processing and the microcurrent measurement (energizing check) are performed by the same FIB device 20. Therefore, it is possible to improve the efficiency of the characteristic evaluation of the sensor.

Further, the FIB processing, the redeposited material removal by the etching process, the microcurrent measurement (energizing check) are performed by the same FIB device 20. Therefore, the characteristic evaluation of the sensor can be performed in the middle of manufacturing the cantilever sensor 1, and the efficiency of the characteristic evaluation of the sensor can be improved.

Second Embodiment

Figure 10:
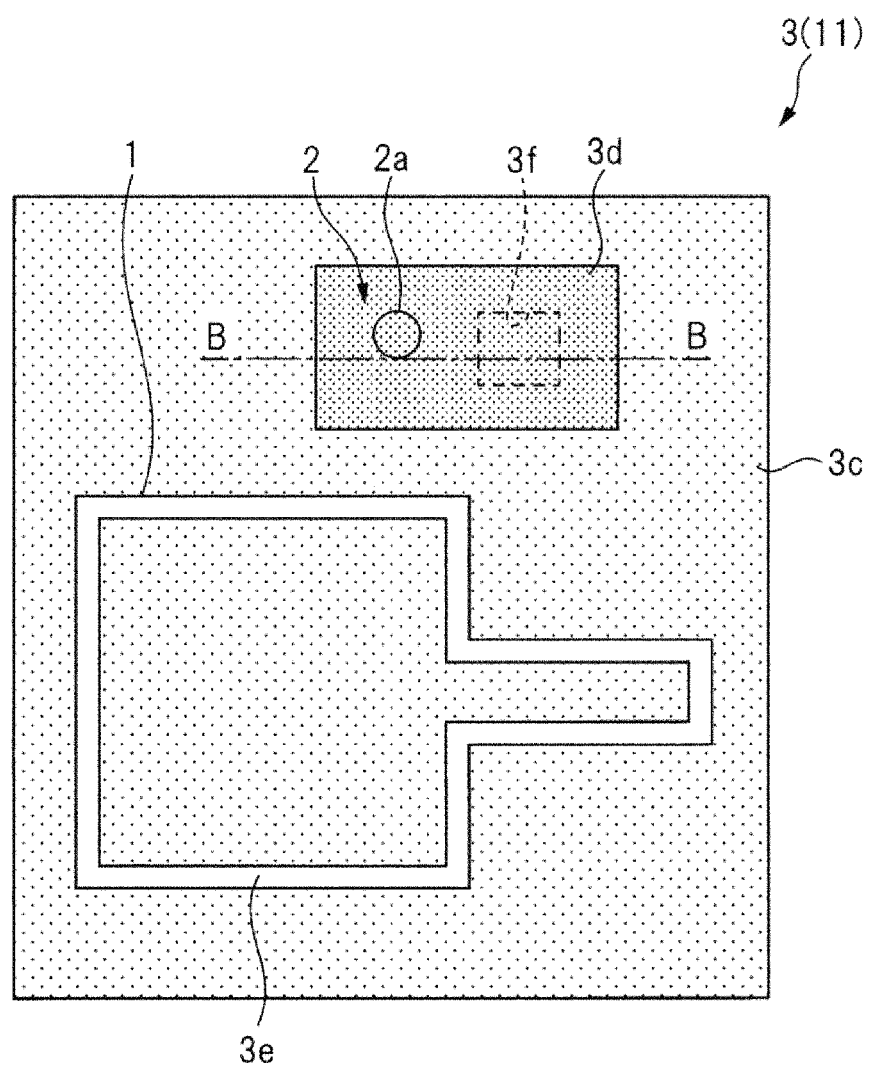
FIG. 10 is a top view illustrating an exemplary measurement pattern in the sensor characteristic evaluation method of a second embodiment of the invention.
Figure 11:
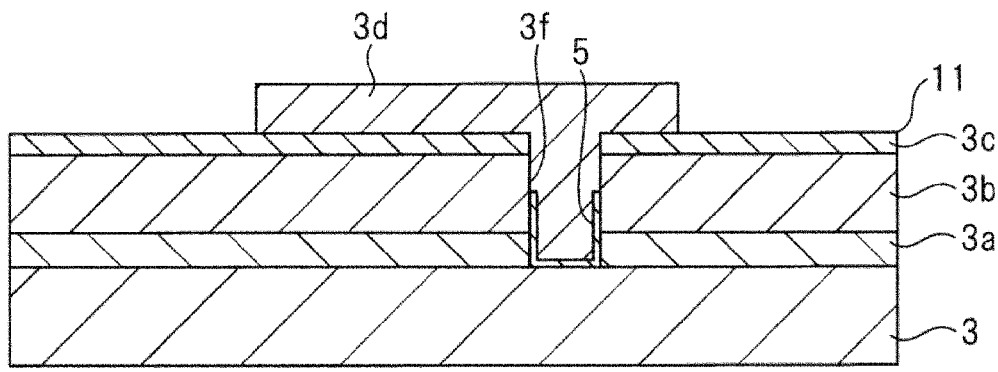
FIG. 11 is a cross-sectional view illustrating an exemplary structure where the redeposited material is attached in the structure taken along line B-B illustrated in FIG. 10.
Figure 12:
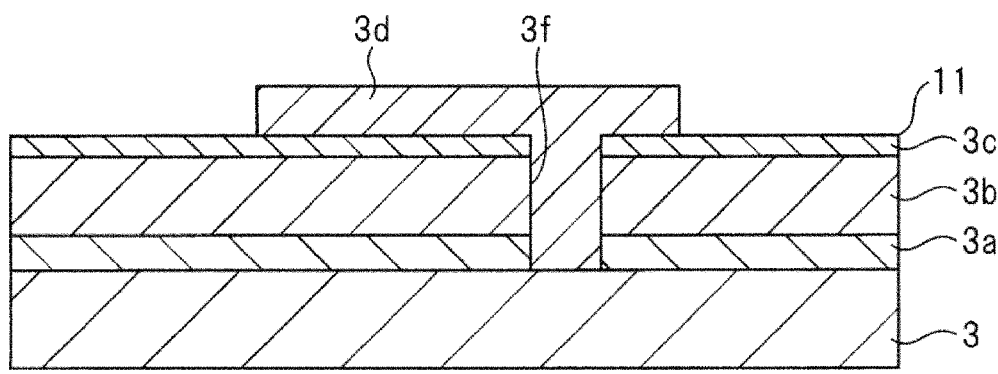
FIG. 12 is a cross-sectional view illustrating an exemplary structure where the redeposited material is not attached in the structure taken along line B-B illustrated in FIG. 10.
Figure 13:
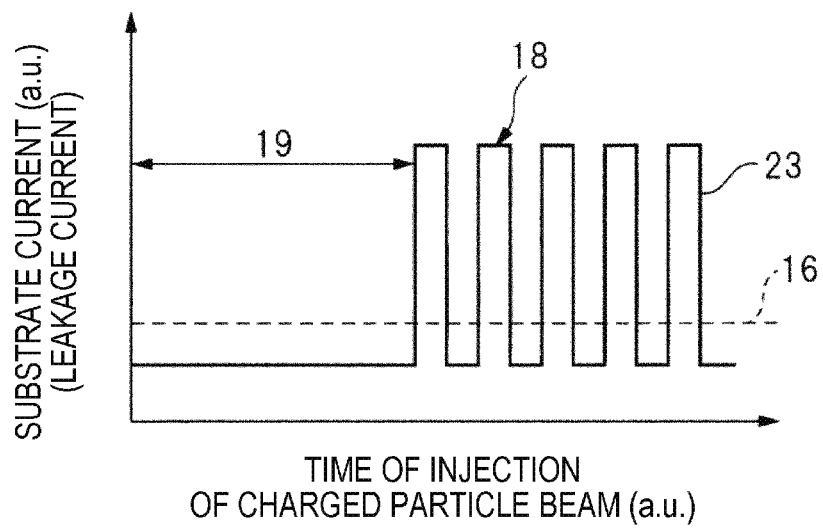
FIG. 13 is a diagram of a pulse waveform illustrating an exemplary measurement result of the leakage current in the structure where the redeposited material illustrated in FIG. 11 is attached.
Figure 14:
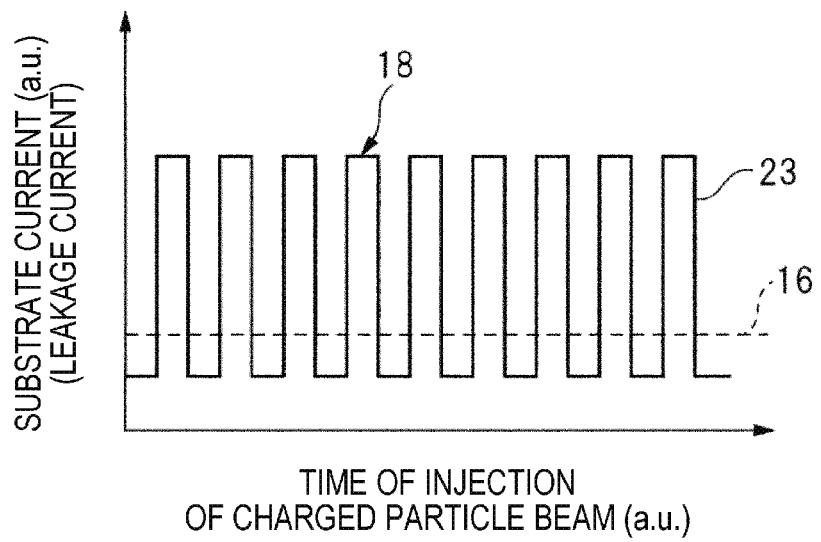
FIG. 14 is a diagram of a pulse waveform illustrating an exemplary measurement result of the leakage current in the structure where the redeposited material illustrated in FIG. 12 is not attached.

FIG. 10 is a top view illustrating an exemplary measurement pattern in the sensor characteristic evaluation method of a second embodiment of the invention. FIG. 11 is a cross-sectional view illustrating an exemplary structure where the redeposited material is attached in the structure taken along line B-B illustrated in FIG. 10. FIG. 12 is a cross-sectional view illustrating an exemplary structure where the redeposited material is not attached in the structure taken along line B-B illustrated in FIG. 10. Further, FIG. 13 is a diagram of a pulse waveform illustrating an exemplary measurement result of the leakage current in the structure illustrated in FIG. 11 where the redeposited material is attached. FIG. 14 is a diagram of a pulse waveform illustrating an exemplary measurement result of the leakage current in the structure illustrated in FIG. 12 where the redeposited material is not attached.

In the first embodiment, the description has been given about a case where the redeposited material is a conductive semiconductor or conductor. However, in the second embodiment, the description will be given about a case where the redeposited material is an insulating material (insulating film).

First, in order to control the potential of the Si substrate 3 a concave portion 3f (open hole) is formed by the FIB (Step S1 illustrated in FIG. 2), and the surface of the Si substrate 3 is exposed. At this time, the redeposited material which is an insulating film 5 such as an SiO film is attached to the bottom of the processed concave portion 3f and the inner wall of the concave portion 3f. Therefore, the redeposited material removal process is preformed (Step S2 illustrated in FIG. 2). Thereafter, a film is formed by the FIB to form a tungsten film (metal film) 3d which is a tungsten electrode in a predetermined shape.

In FIG. 11, there is illustrated a state where the redeposited material of the insulating film (SiO film) 5 is left in a contact portion (the concave portion 3f) processed by the FIB. In FIG. 12, there is illustrated a state where the redeposited material of the insulating film (SiO film) 5 illustrated in FIG. 11 has been removed in the contact portion (the concave portion 3f).

In the second embodiment, whether the insulating film 5 is attached to the bottom of the tungsten film 3d buried in the concave portion 3f of the test element 2 of the Si substrate 3 formed in the FIB processing is detected on the basis of the state of the pulse waveform of the leakage current 23 in the microcurrent measurement, so that the cantilever sensor 1 is evaluated.

As described in the first embodiment, in the microcurrent measurement (energizing check), first, the spot diameter of the focused ion beam 21 emitting to the main body of the cantilever sensor 1 illustrated in FIG. 10, or the test element (test pattern) 2 for removing the redeposited material, the current amount, the pulse width, and the determination current value 16 of the leakage current 23 are set. Subsequently, the focused ion beam 21 is emitted with an arbitrary pulse width. At this time, similarly to the first embodiment, it is desirable that the start time of the charged particle beam emission and the measurement start time of the substrate current (the leakage current 23) are synchronized, thereby making it possible to measure the current in an extremely short time.

As illustrated in FIG. 11, in a case where the redeposited material exists in the contact portion (the concave portion 3f), the tungsten film 3d (tungsten electrode) enters the floating state. Therefore, until a predetermined amount of charges are accumulated in the tungsten film 3d, the substrate current (the leakage current 23) becomes equal to or less than the determination current value 16 as illustrated in FIG. 13. Then, when the charges are accumulated in the floating tungsten film (tungsten electrode) 3d, the leakage current 23 flows even though the redeposited material exists. Therefore, the pulse waveform of the pulse current of the focused ion beam 21 is observed at it is after the charge accumulation time 19 elapsed. In other words, in a case where the charge accumulation time 19 exists from the initial stage of the start of the microcurrent measurement, and thereafter, in a case where the pulse waveform is observed, it is determined that the redeposited material exists.

On the other hand, as illustrated in FIG. 12, in a case where the redeposited material does not exist in the concave portion 3f, the pulse waveform of the pulse current of the focused ion beam 21 is observed as it is from the initial stage of the measurement start of the microcurrent measurement as illustrated in FIG. 14. In other words, the current value equal to or greater than the determination current value 16 is observed from the initial stage of the measurement start of the microcurrent measurement. Therefore, in this case, it can be determined that there is no redeposited material.

Like this, in a case where there is an insulating redeposited material in the contact portion (the concave portion 3f), a relation between the emission current and the measured substrate current (the leakage current 23) is reversed to that of the first embodiment.

Further, in the residue of the insulating film 5, the leakage current 23 is large, and thus the charge accumulation time 19 is significantly short. Therefore, there is a need to strictly manage the settings of the determination current value 16 and the pulse width.

The effects obtained by the characteristic evaluation method and the charged particle beam device (the FIB device 20) of the cantilever sensor 1 of the second embodiment are similar to those of the first embodiment, and the redundant descriptions will be omitted.

Third Embodiment

Figure 15:
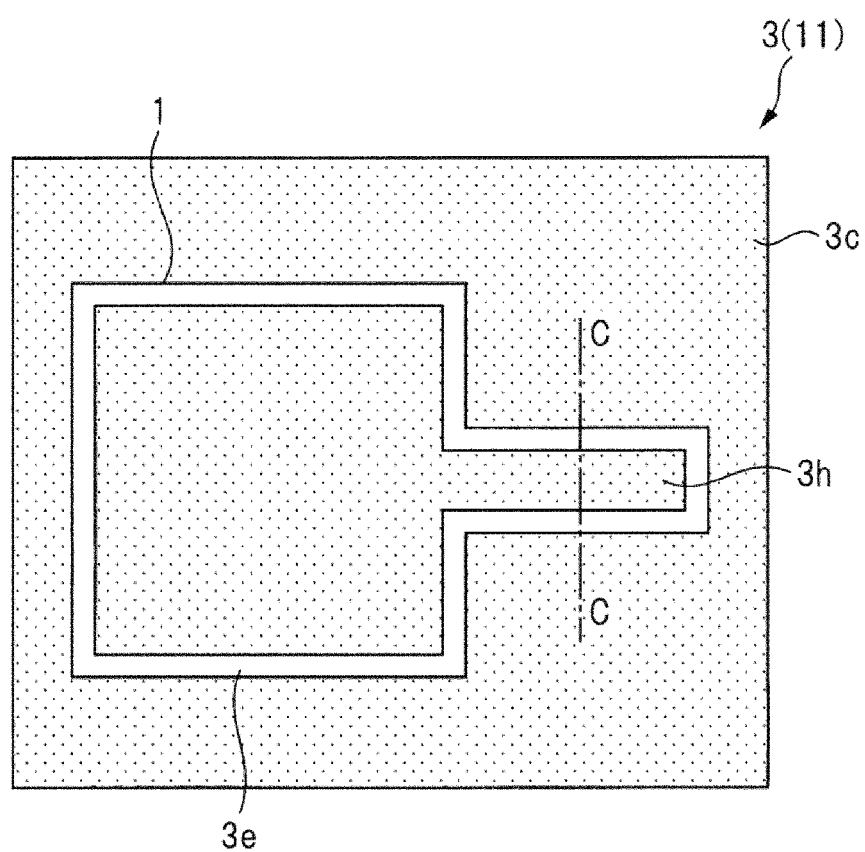
FIG. 15 is a top view illustrating an exemplary measurement pattern in the sensor characteristic evaluation method of the second embodiment of the invention.
Figure 16:
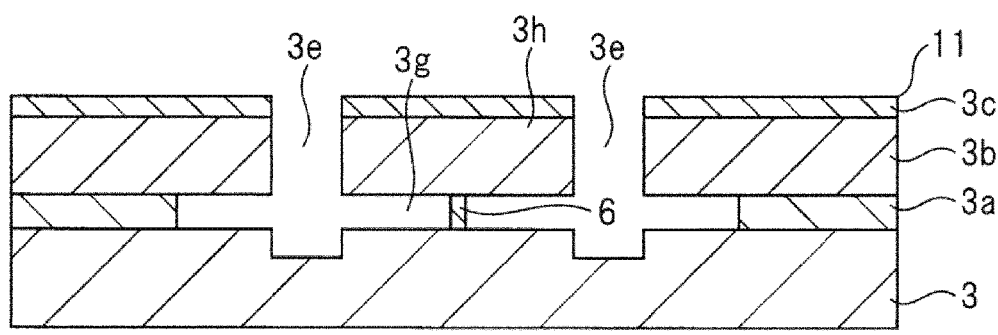
FIG. 16 is a cross-sectional view illustrating an exemplary structure where a $SiO_2$ film (BOX layer) is etched by a gas phase etching but partially left in the structure taken along line C-C illustrated in FIG. 15.
Figure 17:
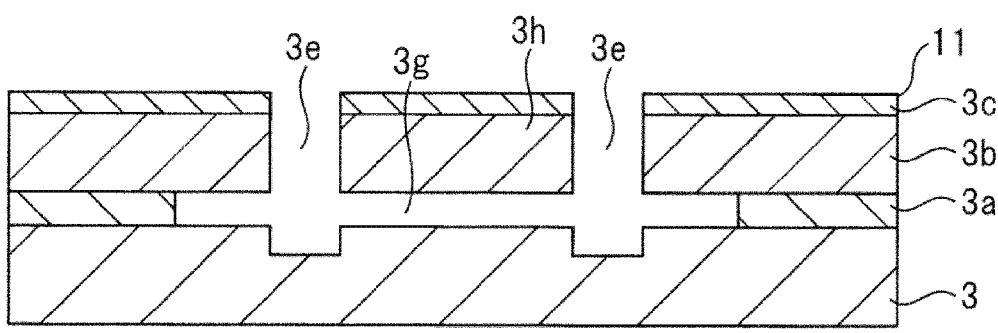
FIG. 17 is a cross-sectional view illustrating an exemplary structure where the $SiO_2$ film (BOX layer) is completely etched by the gas phase etching in the structure taken along line C-C illustrated in FIG. 15.
Figure 18:
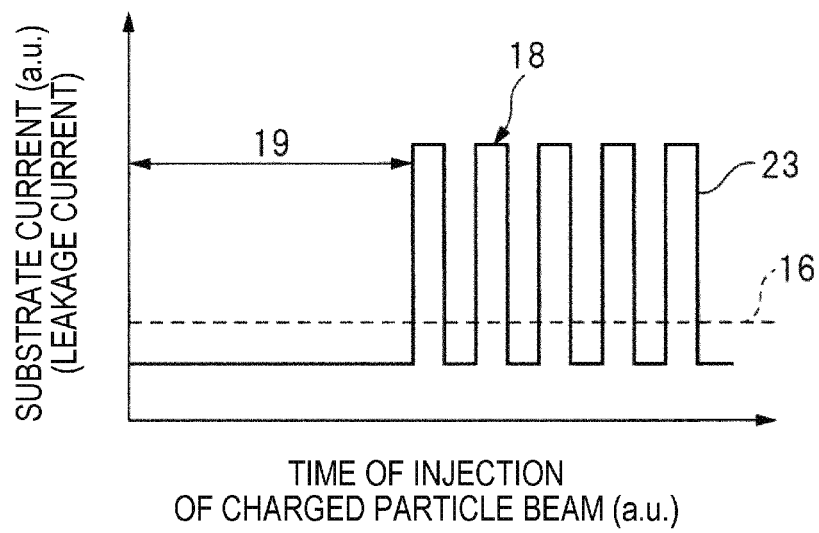
FIG. 18 is a diagram of a pulse waveform illustrating an exemplary measurement result of the leakage current in the structure illustrated in FIG. 16 where the $SiO_2$ film (BOX layer) is left.
Figure 19:
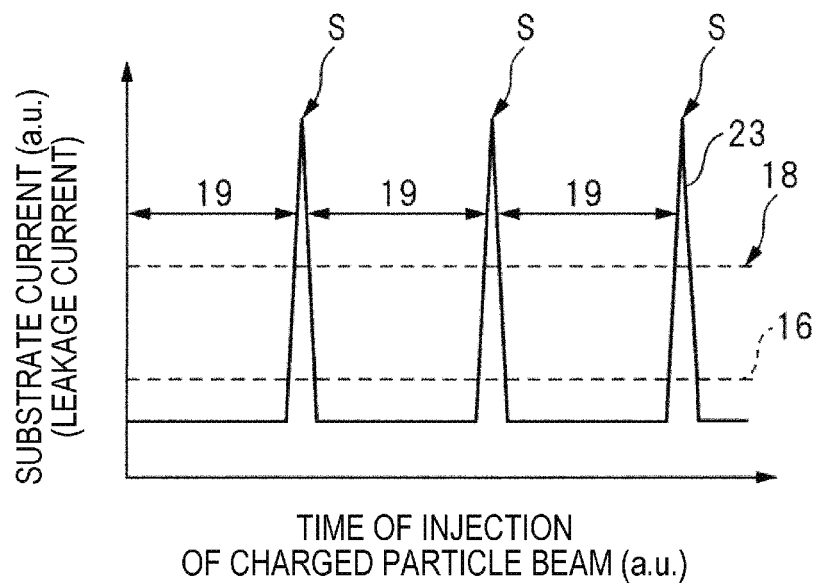
FIG. 19 is a diagram of a pulse waveform illustrating an exemplary measurement result of the leakage current in the structure illustrated in FIG. 17 where the $SiO_2$ film (BOX layer) is not left.

FIG. 15 is a top view illustrating an exemplary measurement pattern in the sensor characteristic evaluation method of the second embodiment of the invention. FIG. 16 is a cross-sectional view illustrating an exemplary structure where a par of $SiO_2$ film (BOX layer) is not etched by a gas phase etching and is left in the structure taken along line C-C illustrated in FIG. 15. FIG. 17 is a cross-sectional view illustrating an exemplary structure where the $SiO_2$ film (BOX layer) is completely etched by the gas phase etching in the structure taken along line C-C illustrated in FIG. 15. Further, FIG. 18 is a diagram of a pulse waveform illustrating an exemplary measurement result of the leakage current in the structure illustrated in FIG. 16 where the $SiO_2$ film (BOX layer) is left. FIG. 19 is a diagram of a pulse waveform illustrating an exemplary measurement result of the leakage current in the structure illustrated in FIG. 17 where the $SiO_2$ film (BOX layer) is not left.

In the first and second embodiments, an exemplary application as a method of determining the redeposited material removal processed by the FIB has been described. In the third embodiment, an example applied to a method of determining whether a gas phase etching process is successful will be described.

The cantilever sensor 1 illustrated in FIGS. 15 to 17 is a microelement processed by the FIB. Similarly to the first and second embodiments, the SOI film 3b provided with the BOX layer made of a $SiO_2$ film formed on the Si substrate 3 is processed by the FIB in a predetermined shape. Then, a left oxide film 6 which is the redeposited material (foreign matter) is removed, and the cantilever sensor is formed in the sample 11. In the structure illustrated in FIG. 17, there is illustrated an exemplary state of the procedure in which the $SiO_2$ film of the BOX layer is etched by the gas phase etching in the sample 11 from which the redeposited material is removed.

Then, FIG. 16 illustrates a state where the left oxide film 6 exists in the lower portion of a cantilever beam (beam portion) 3h of the cantilever sensor 1 illustrated in FIG. 15 due to insufficient gas phase etching procedure. On the other hand, FIG. 17 illustrates a state where the gas phase etching procedure is completed, and the $SiO_2$ film of the lower portion of the cantilever beam 3h is removed.

In the third embodiment, whether there is a foreign matter (the left oxide film 6) is left in a hollow portion 3g in the lower portion of the cantilever beam 3h of the cantilever sensor 1 in the sample 11 formed by the FIB processing is detected by measuring the leakage current 23 through the procedure of the microcurrent measurement and on the basis of the state of the pulse waveform of the leakage current 23, so that the cantilever sensor 1 is evaluated.

As illustrated in the first embodiment, in the microcurrent measurement, first, the spot diameter of the focused ion beam 21 emitted to the main body of the cantilever sensor 1, the current amount, the pulse width, and the determination current value 16 of the leakage current 23 are set. Subsequently, the focused ion beam 21 is emitted to the cantilever sensor 1 with an arbitrary pulse width. At this time, as described above, it is desirable that the emission start time of the charged particle beam and the measurement start time of the substrate current (the leakage current 23) are synchronized so as to measure the current in an extremely short time.

As illustrated in FIG. 16, in a case where the left oxide film 6 made of a $SiO_2$ film exists even a little in the lower portion of the cantilever beam (movable portion) 3h of the cantilever sensor 1, the cantilever beam 3h is not moved at all even when a voltage is applied from the outside.

In other words, in a case where the focused ion beam 21 is emitted in a pulse waveform to a part of the MEMS sensor (the cantilever sensor 1), the substrate current (the leakage current 23) is measured as illustrated in FIG. 18. This result is the same as that illustrated in FIG. 9 of the first embodiment. In other words, the substrate current (the leakage current 23) is equal to or less than the determination current value 16 until a predetermined amount of charges are accumulated in the element of the floating cantilever sensor 1. Then, when the charges are accumulated in the floating cantilever sensor 1, and the charge accumulation time 19 elapses, the leakage current flows through the $SiO_2$ film. Therefore, the pulse waveform of the pulse current of the focused ion beam 21 is observed as it is.

In a case where the phenomenon is observed (the case of the measurement result illustrated in FIG. 18), it is determined that the gas phase etching is insufficient. In a case where the phenomenon is observed, the etching is additionally performed with the gas phase etching, and the same characteristic evaluation is performed repeatedly. No matter how many times this method is performed repeatedly, the increase in the foreign matter and the metal contamination is extremely small. In addition, a defect of the gas phase etching can be checked in the middle of the manufacturing, and a failure can be recovered. Therefore, it is possible to improve a manufacturing yield of the cantilever sensor 1.

On the other hand, as illustrated in FIG. 17, in a case where all the $SiO_2$ film is removed in the lower portion of the cantilever beam 3h which is a movable portion of the cantilever sensor 1, the cantilever beam 3h is operated by an electromagnetic force when a voltage is applied from the outside. The operation of the cantilever beam 3h caused by the voltage application means that the cantilever beam 3h is bent by an electrostatic force, and the cantilever beam 3h and the Si substrate 3 come into contact.

As illustrated in FIG. 19, the substrate current (the leakage current 23) is equal to or less than the determination current beam 16 until the focused ion beam 21 is emitted to accumulate the charges (at the charge accumulation time 19). When the cantilever beam 3h and the Si substrate 3 come into contact by the electrostatic force (to be switched), the accumulated charges are discharged in an instant (S portion illustrated in FIG. 19). In other words, a large substrate current (the leakage current 23) is observed instantly. Then, the electrostatic force disappears as soon as the charges are discharged, the cantilever beam 3h and the Si substrate 3 are separated, and the substrate current (the leakage current 23) comes to be equal to or less than the determination current value 16.

In this way, in a case where the gas phase etching is normally performed (a case where there is no left oxide film 6), there is observed a phenomenon that the charges are accumulated and discharged in a predetermined period. In a case where such a phenomenon is observed, a product is determined as normal, and then the next procedure is performed.

Other effects obtained by the characteristic evaluation method and the charged particle beam device (the FIB device 20) of the cantilever sensor 1 of the third embodiment are similar to those of the first embodiment, and the redundant description will be omitted.

Hitherto, the invention implemented by the inventor has been specifically described on the basis of the embodiments. However, the invention is not limited to the above-described embodiments, but various modifications can be made. For example, the embodiments are described in a clearly understandable way for the invention, and thus the invention is not necessarily to provide all the configurations described above.

In addition, some configurations of a certain embodiment may be replaced with the configurations of another embodiment, and the configuration of the other embodiment may also be added to the configuration of a certain embodiment. Further, additions, omissions, and substitutions may be made on some configurations of each embodiment using other configurations. Further, while the respective members and relative sizes in the drawings are simplified and idealized in order to help with understanding on the present invention, the structure may be a more complicate shape in practice.

In the first to third embodiments, the description has been given about a case where the focused ion beam 21 of the FIB device 20 is used as the charged particle beam emitted in the microcurrent measurement. However, the electronic beam discharged from the electronic beam barrel 7 of the FIB device 20 may be used as the charged particle beam.

In addition, in the first to third embodiments, the FIB processing, the removal process of the redeposited material, and the leakage current determination process have been described to be performed by the same FIB device 20. However, the FIB device 20 performs, for example, the FIB processing and the leakage current determination process, and the removal process of the redeposited material may be performed by another device.

At that time, the FIB device 20 may be a device which automatically performs the FIB processing and the leakage current determination process. In addition, the FIB device 20 may be a device which automatically performs the FIB processing, the removal process of the redeposited material, and the leakage current determination process.

REFERENCE SIGNS LIST

1: cantilever sensor (sensor, MEMS sensor, microstructural sensor)
1a: local region
2: test element
2a: local region
3: Si substrate
3a: oxide film
3b: SOI film
3c: SiN film
3d: tungsten film (metal film)
3e: groove
3f: concave portion
3g: hollow portion 3h: cantilever beam (beam portion)
4: Si film (semiconductor film, redeposited material)
5: insulating film (redeposited material)
6: left oxide film (foreign matter, redeposited material)
7: electronic beam barrel
8: system control unit (control unit)
9: timer (time measuring unit)
10: microcurrent measuring device (current measuring unit)
11: sample (substrate)
12: device body
13: stage
14: etching gas
15: Faraday cup
16: determination current value
17: gas gun
18: total current
19: charge accumulation time
20: FIB device (charged particle beam device)
21: focused ion beam (FIB, charged particle beam)
22: FIB barrel (charged particle beam discharging unit)
23: leakage current

The invention claimed is:

1. A sensor characteristic evaluation method, comprising:
   (a) performing a focused ion beam processing in which a focused ion beam is emitted to a substrate to form a microstructural sensor, or the microstructural sensor and a test element; and
   (b) emitting, after the procedure (a), a charged particle beam to any one of the microstructural sensor or the test element, and measuring a leakage current from the substrate, wherein
   the microstructural sensor is evaluated on the basis of a measurement result of the leakage current.

2. The sensor characteristic evaluation method according to claim 1, wherein
   in the procedure (b), the leakage current from the substrate caused by the emitting of the charged particle beam is measured, and the microstructural sensor is evaluated on the basis of a state of a pulse waveform of the leakage current.

3. The sensor characteristic evaluation method according to claim 2, wherein
   the microstructural sensor is a MEMS sensor,
   the charged particle beam is a focused ion beam, and
   the procedure (a) and the procedure (b) are performed in the same focused ion beam device.

4. The sensor characteristic evaluation method according to claim 2, wherein
   in the procedure (b), a time to emit the charged particle beam and a time to measure the leakage current are synchronized to evaluate the microstructural sensor.

5. The sensor characteristic evaluation method according to claim 4, wherein
   the substrate is a silicon substrate, and
   whether a conductor film or a semiconductor film is attached to a groove of any one of the microstructural sensor or the test element of the silicon substrate formed in the procedure (a) is detected on the basis of a state of the pulse waveform of the leakage current in the procedure (b) to evaluate the microstructural sensor.

6. The sensor characteristic evaluation method according to claim 4, wherein
   the substrate is a silicon substrate, and
   whether an insulating film is attached to a bottom of a metal film buried in a concave portion of the test element of the silicon substrate formed in the procedure (a) is detected on the basis of a state of the pulse waveform of the leakage current in the procedure (b) to evaluate the microstructural sensor.

7. The sensor characteristic evaluation method according to claim 4, wherein
   the substrate is a silicon substrate,
   whether a foreign matter exists in a hollow portion of a lower portion of a beam portion of the microstructural sensor of the silicon substrate formed in the procedure (a) is detected on the basis of a state of the pulse waveform of the leakage current in the procedure (b) to evaluate the microstructural sensor.

8. The sensor characteristic evaluation method according to claim 1, wherein
   the microstructural sensor is a MEMS sensor, and
   in the procedure (b), the charged particle beam is emitted to the test element which is formed around the MEMS sensor.

9. The sensor characteristic evaluation method according to claim 1, wherein
   after the procedure (a) and before the procedure (b), an etching gas is emitted to the substrate to etch the substrate.

10. The sensor characteristic evaluation method according to claim 9, wherein
    the procedure (a), the etching process, and the procedure (b) are performed by the same focused ion beam device.

11. The sensor characteristic evaluation method according to claim 1, wherein
    in a case where the leakage current comes to be measured again by a characteristic evaluation of the microstructural sensor on the basis of the measurement result of the leakage current of the procedure (b), an etching gas is emitted to the substrate after the procedure (b) to etch the substrate.

12. The sensor characteristic evaluation method according to claim 1, wherein
    in the procedure (b), the leakage current from a stage which supports the substrate is measured, and the microstructural sensor is evaluated on the basis of a state of a pulse waveform of the leakage current.

* * * * *